United States Patent
Armani et al.

(10) Patent No.: US 10,791,619 B2
(45) Date of Patent: Sep. 29, 2020

(54) DEVICE FOR HEATING AND COOLING BY A PRINTED CIRCUIT FOR REGENERATING ELECTRONIC COMPONENTS SUBJECTED TO RADIATION

(71) Applicant: COMMISSARIAT A L'ENERGIE ATOMIQUE ET AUX ENERGIES ALTERNATIVES, Paris (FR)

(72) Inventors: Jean-Marc Armani, Montigny le Bretonneux (FR); Jean-Lucien Mazeau, Paris (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 212 days.

(21) Appl. No.: 15/566,197

(22) PCT Filed: Apr. 11, 2016

(86) PCT No.: PCT/EP2016/057878
§ 371 (c)(1),
(2) Date: Oct. 12, 2017

(87) PCT Pub. No.: WO2016/166043
PCT Pub. Date: Oct. 20, 2016

(65) Prior Publication Data
US 2018/0092198 A1    Mar. 29, 2018

(30) Foreign Application Priority Data
Apr. 13, 2015  (FR) ..................... 15 53178

(51) Int. Cl.
*H05K 1/02*  (2006.01)
*H01L 23/34*  (2006.01)
(Continued)

(52) U.S. Cl.
CPC ............ *H05K 1/0201* (2013.01); *F24F 11/88* (2018.01); *H01L 23/345* (2013.01); *H01L 23/38* (2013.01);
(Continued)

(58) Field of Classification Search
CPC ....... G06F 1/181–182; H05K 7/20218–20381; H05K 7/20409–20418;
(Continued)

(56) References Cited

U.S. PATENT DOCUMENTS 6,262,392 B1    7/2001  Morton et al.
7,193,850 B2 *  3/2007  Pal .................. H05K 7/1461
                                                165/104.33
(Continued)

*Primary Examiner* — Robert J Hoffberg
(74) *Attorney, Agent, or Firm* — Baker & Hostetler LLP

(57) ABSTRACT

A thermal conditioning device for an electronic component mounted in a package positioned on a multilayer printed circuit board comprises: at least one active component arranged on the printed circuit board, and suitable for producing or absorbing thermal energy, at least one heat transfer surface internal to the printed circuit board, located under the package, a device for transferring the thermal energy between the active component or components and the heat transfer surface, at least one metallic element linking the heat transfer surface to the package situated on the multilayer printed circuit board. A printed circuit board comprising such a thermal conditioning device for an electronic component, and associated heating and cooling methods are also provided.

12 Claims, 4 Drawing Sheets

(51) Int. Cl.
*H01L 23/38* (2006.01)
*H05B 3/22* (2006.01)
*F24F 11/88* (2018.01)

(52) U.S. Cl.
CPC ............ *H05B 3/22* (2013.01); *H05K 1/0206* (2013.01); *H05K 1/0207* (2013.01)

(58) Field of Classification Search
CPC ...... H05K 7/20009–202; H05K 1/0201; H01L 23/367–3677; H01L 23/473; H01L 23/46–467; F24F 11/88; H05B 3/22
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 7,352,585 B2* | 4/2008 | Mandel | ............... | H01L 21/4878 361/714 |
| 7,440,281 B2* | 10/2008 | Bailey | .................... | H01L 23/26 257/E23.087 |
| 7,808,780 B2* | 10/2010 | Brunschwiler | ........... | G06F 1/20 165/104.33 |
| 7,997,087 B2* | 8/2011 | Venkatasubramanian | .................... | F25B 21/02 165/104.33 |
| 8,391,008 B2* | 3/2013 | Dede | .................... | H01L 23/4735 165/104.21 |
| 8,445,818 B2 | 5/2013 | Marcus et al. | | |
| 8,908,383 B1* | 12/2014 | Railkar | ................ | H05K 1/0206 361/704 |
| 9,118,126 B2* | 8/2015 | Chang | .................... | H01R 13/10 |
| 2002/0008963 A1* | 1/2002 | DiBene, II | ................ | G06F 1/18 361/720 |
| 2007/0211426 A1* | 9/2007 | Clayton | ................ | H01L 23/473 361/689 |
| 2007/0250731 A1* | 10/2007 | Romero | ................ | G06F 1/3203 713/324 |
| 2008/0019097 A1* | 1/2008 | Zhang | .................... | F28F 13/00 361/704 |
| 2009/0051446 A1 | 2/2009 | McCracken | | |
| 2009/0151989 A1* | 6/2009 | Hunrath | ................ | H05K 1/0271 174/257 |
| 2009/0282852 A1* | 11/2009 | Venkatasubramanian | .................... | F25B 21/02 62/259.2 |
| 2010/0079959 A1* | 4/2010 | Letz | .................... | H01L 25/0657 361/717 |
| 2010/0112826 A1 | 5/2010 | Frasco | | |
| 2010/0302740 A1* | 12/2010 | Mouli | .................... | H01L 23/367 361/715 |
| 2012/0020027 A1* | 1/2012 | Dungan | ............... | H01L 25/0652 361/718 |
| 2012/0099274 A1* | 4/2012 | Winter | ................ | H01L 23/3677 361/689 |
| 2012/0201008 A1 | 8/2012 | Hershberger et al. | | |
| 2013/0140602 A1* | 6/2013 | Chang | ............... | H01L 23/49811 257/139 |
| 2014/0027435 A1 | 1/2014 | Chou | | |
| 2014/0345757 A1* | 11/2014 | Hartmann | ................ | C21D 8/04 148/639 |
| 2015/0003017 A1* | 1/2015 | Tantolin | ................ | H01L 23/38 361/701 |
| 2015/0319880 A1* | 11/2015 | Strickland | ................ | H05K 7/20 361/711 |

\* cited by examiner

DEVICE FOR HEATING AND COOLING BY A PRINTED CIRCUIT FOR REGENERATING ELECTRONIC COMPONENTS SUBJECTED TO RADIATION

CROSS-REFERENCE TO RELATED APPLICATIONS

This application is a National Stage of International patent application PCT/EP2016/057878, filed on Apr. 11, 2016, which claims priority to foreign French patent application No. FR 1553178, filed on Apr. 13, 2015, the disclosures of which are incorporated by reference in their entirety.

FIELD OF THE INVENTION

The invention lies in the field of hardening against ionizing radiation, and more particularly to a device allowing regeneration, on a printed circuit board, of an electronic component exposed to ionizing radiation using a high-temperature thermal anneal.

BACKGROUND

CMOS (Complementary Metal Oxide Semiconductor) electronic components are sensitive to gamma ionizing radiation and their electrical characteristics degrade after a prolonged exposure. It is possible to regenerate the irradiated CMOS components by the application of a high-temperature thermal anneal. The application of the regeneration during the use of the component can make it possible to significantly extend its life in a radiative environment.

The cooling of the components which have been heated in order to be regenerated can make it possible to restore a normal situation more rapidly, and to thus reduce the downtime of the component. Moreover, the cooling can also be useful in the case of small signal low noise analog circuits for improving their electrical performances.

However, the diversity of component types on the market can make difficult the systematic application of the heating or of the cooling directly on the package. Examples that can be cited include certain photo or video sensors, in through-hole pin packages or in BGA (Ball Grid Array) packages, for which the top of the package is unusable.

The problem also arises for components of small dimensions (smaller than those of the heating resistor).

The invention described provides a solution for these situations by transferring heat or cold to a component package by using layers of the printed circuit on which it is mounted.

Those skilled in the art know solutions for heating all of a whole printed circuit board, that make it possible to regulate its temperature to allow it to operate in environmental conditions outside of the expected ranges of use by heating it on the surface. However, these solutions do not make it possible to bring one of the components of the circuit to very high temperatures.

One of these solutions is for example described in the patent application U.S. Pat. No. 6,262,392 B1. FIG. 1 describes a case in which the printed circuit board has a top layer intended to heat all of the components of the circuit. In this solution, the thermal energy delivered by resistors is distributed throughout the top layer. This solution poses the problem of dissipation of the energy delivered, which can be a problem for reaching the high temperatures necessary to the regeneration by thermal annealing of a component. Finally, such a device heats all the components of the printed circuit board, which can degrade the components that are not intended to be regenerated by the high-temperature anneal process.

FIG. 2 of the same application presents a solution in which the heating layer is situated inside the printed circuit board. This solution poses, in addition to the problems of FIG. 1, the problem of the low thermal conductivity between the layer internal to the printed circuit board and the components positioned on the surface.

Also known to those skilled in the art are heating solutions localized on a component, as in the U.S. Pat. No. 8,445,818 B2. This patent presents in FIG. 2 a solution for heating an electronic component on a printed circuit board, in which a component intended to produce heat is positioned on top of the electronic component to be heated. However, this solution does not provide a response to the cases where the top of the electronic component package is not accessible, or to the cases where the package is of a smaller size than the heating component.

The same patent presents in FIG. 3 a heating solution in which the printed circuit board comprises a top heating layer, on which the electronic components are placed. This solution is not suitable because the top layer covers all of the printed circuit board, and requires the use of heating components positioned within the heating layer.

SUMMARY OF THE INVENTION

The invention therefore proposes to resolve the problem of bringing a component on a printed circuit to a high temperature, in particular to perform the thermal annealing of a CMOS component subjected to ionizing radiation and the consecutive cooling thereof, by proposing a device using heating resistors or elements producing cold mounted on the surface of the printed circuit board, and linked to a heat transfer surface internal to the printed circuit board, arranged under the component, to which said heat transfer surface is linked by one or more metallic elements, the metallic elements possibly being the leads of the package or holes of the printed circuit board filled with metallic links, called vias.

The size of the heat transfer surface is adapted to the size of the component, so as to ensure an optimal use of the heat produced by the resistors, and to thus reach the very high temperatures needed to perform a thermal annealing, these temperatures being generally higher than a hundred or so degrees Celsius.

The invention applies also to active components intended to produce cold, thus allowing a faster return to a nominal operating temperature.

Thus, the invention proposes a thermal conditioning device for an electronic component mounted in a package positioned on a multilayer printed circuit board. The device according to the invention is characterized in that it comprises:

at least one active component arranged on said printed circuit, and suitable for producing or absorbing thermal energy, at least one heat transfer surface internal to said printed circuit board, located under said package, at least one device for transferring the thermal energy from said active component or components to said heat transfer surface, at least one metallic element linking said heat transfer surface to said package situated on the multilayer printed circuit board.

According to one embodiment, it further comprises a collector track thermally linked to said active component(s).

Advantageously, the collector track is in contact with the package of the electronic component.

In another embodiment of the device according to the invention, the heat transfer surface is linked to the collector track, from which it is electrically insulated by power diodes.

In another embodiment of the device according to the invention when it comprises a collector track, the device for transferring the thermal energy comprises at least one metallic element linking the collector track to the heat transfer surface internal to the printed circuit board.

In another embodiment, when the active component or components intended to produce thermal energy are components with through-hole leads, the transfer of the thermal energy produced is performed by at least one of the leads of the active component or components.

Advantageously, in all of the embodiments of the device according to the invention, the heat transfer surface internal to the multilayer printed circuit board is positioned in the internal layer of the printed circuit board closest to the electronic component.

In another embodiment of the device according to the invention, the device for transferring the thermal energy comprises a plurality of conductive surfaces internal to the printed circuit board, positioned on either side of a part of said heat transfer surface without contact therewith, said conductive surfaces (541, 542) being linked to said active component or components (101) by at least one metallic element.

The device can be applied advantageously when the electronic component is a CMOS component that can be regenerated by a high-temperature thermal anneal.

Advantageously, the active component or components are chosen from among heating resistors and thermoelectric elements.

In one embodiment of the device according to the invention, the heat transfer surface is linked to an electrical potential of the printed circuit.

In another embodiment of the device according to the invention, it further comprises a module for regulating the temperature of the electronic component, configured to control the active elements.

The invention also relates to a multilayer printed circuit board comprising a device as described previously.

Finally, the invention relates to a thermal conditioning method for an electronic component positioned in a package situated on a multilayer printed circuit board, said printed circuit board comprising a device as described previously. The method is characterized in that it comprises a step of temporary activation of at least one active component intended to produce heat.

The method can also comprise a later step of temporary activation of at least one active component intended to produce cold.

BRIEF DESCRIPTION OF THE DRAWINGS

The invention will be better understood and other features and advantages will become apparent on reading the following description, given in a nonlimiting manner, and from the attached figures in which.

DETAILED DESCRIPTION

Figure 1A:
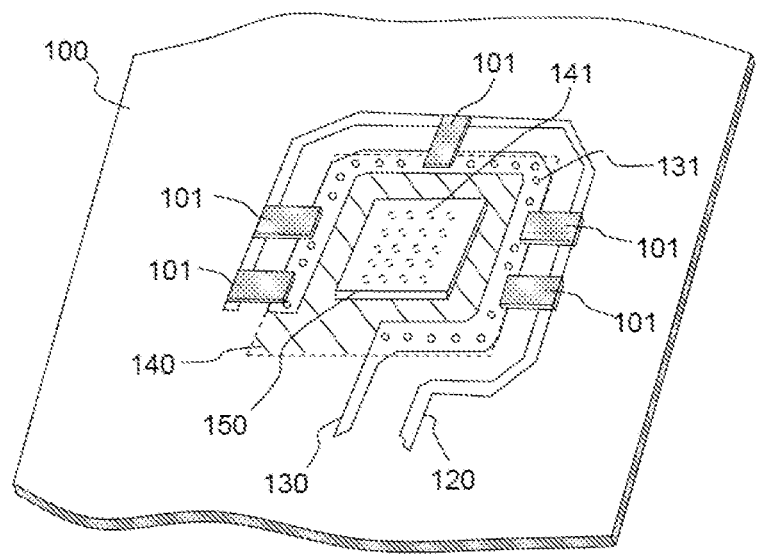
FIGS. 1a and 1b present a plan view and a cross-sectional view of the device according to an embodiment of the invention.
Figure 1B:
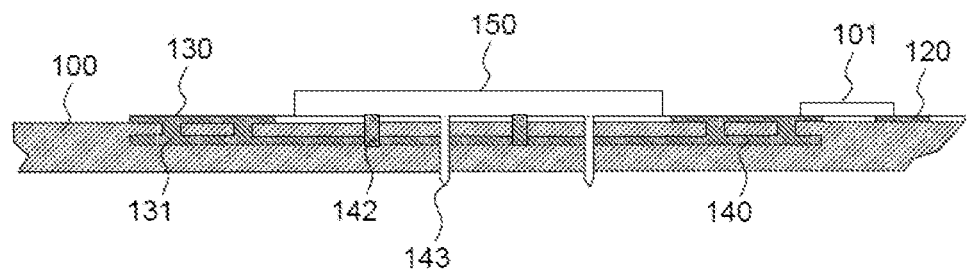

FIGS. 1a and 1b present a plan view and a cross-sectional view of the device according to a first embodiment of the invention.

In this embodiment, active elements 101 are positioned on the surface of a printed circuit 100. These active elements are electrically and thermally linked on the one hand to a first track 120, having a first electrical potential, and, on the other hand, to a second track 130, called collector track, having a second electrical potential. The first electrical potential can for example be a power supply voltage, and the second electrical potential a ground. All the configurations of potentials are possible provided that the potentials are suited to the active components and are compatible with the component to be regenerated.

The active components are suitable for producing or absorbing thermal energy. They can for example be heating resistors, in order to produce heat, or Peltier thermoelectric elements, in order to produce cold. These components can either be components with through-hole leads, or SMD (surface-mount device) components.

The rest of the document will deal with the production of thermal energy, i.e. of heat, but applies equally to the absorption of thermal energy, i.e. the production of cold.

The multilayer printed circuit board comprises a heat transfer surface 140 internal to the substrate of the printed circuit board. This heat transfer surface 140 covers a zone situated under the location of the package of the electronic component targeted by the anneal method. Its shape is adapted for covering a zone corresponding to the location of the package of the electronic component and of a part of the collector track, while being as small as possible. For better efficiency, there should be around this surface a significant zone without metallic conductors, in order to keep the heat as locally as possible.

This heat transfer surface 140 is linked to the active elements 101 by a device for transferring the thermal energy. In FIG. 1, this transfer device takes the form of the collector track 130, associated with metallic elements 131 linking it to the heat transfer surface 140. In other embodiments described hereinbelow, this device can be embodied by the leads of the active components, an interleaving of layers internal to the substrate, combinations of these different embodiments, or any other implementation making it possible to convey thermal energy between the active components 101 and the heat transfer surface 140, by conduction and/or by radiation.

The heat transfer surface 140 is also linked to the package 150 of the electronic component to which the thermal energy has to be transferred by metallic elements 141.

Thus, the active components 101 produce thermal energy, which is transmitted to the collector track 130 to which they are linked. The collector track 130 transmits this energy to the heat transfer surface 140 internal to the printed circuit board, by conduction through metallic elements 131. Typically, these metallic elements are vias produced in the printed circuit board so as to link the collector track 130 to the heat transfer surface 140.

The thermal energy produced is then propagated in the heat transfer surface 140, to be transmitted to the package 150 of the electronic component by:

radiation from the heat transfer surface 140 situated under the component, or absorption of the radiation from the electronic component in the case of cold production, and conduction through the metallic elements 141.

Advantageously, when the package 150 of the electronic component is a package with through-hole leads, the leads 143 having the same electrical potential as the heat transfer surface 140 internal to the substrate of the printed circuit board can be linked to the heat transfer surface. Such is the case in FIG. 1*b* in cross section, where the metallic elements 141 linking the heat transfer surface to the package of the electronic component, are vias 142 and leads 143 of the package of the electronic component.

Thus, in a variant of an embodiment of the invention, the collector track 130 and the heat transfer surface 140 are linked to the ground of the printed circuit board, the ground through-hole leads of the electronic component then being linked to the heat transfer surface.

Similarly, when the active components are components with through-hole leads, they can be linked directly to the heat transfer surface 140, the collector track 130 then being no longer essential to the operation of the device.

The device of the invention makes it possible to use active elements 101 of limited size for the thermal conditioning of an electronic component by heating or cooling. Since these components are not in direct contact with the package 150 of the electronic component, their relative size does not influence the feasibility of the solution.

These active elements are mounted on the substrate of the printed circuit board by techniques that are conventional fabrication techniques, but are specific to the high-temperature domain. The heat produced is concentrated on a very limited surface of the printed circuit board, thus avoiding excessive thermal loss. This heat is transmitted to the component to be heated, by radiation and conduction, by using the internal layers of the PCB and electrical links by vias or the leads of the components.

The positioning of the active components on one and the same side of the printed circuit board can make it possible to improve the heat transfer to the electronic component by benefiting also from a direct heat conduction on the pins at the periphery of this component that are linked directly to the same electrical potential as that of the heat transfer surface.

The invention is not limited to the thermal anneal of a single component, but can be adapted for the thermal annealing of several electronic components. For this purpose, the heat transfer surface will have to be arranged under all of these components. In another embodiment, the printed circuit board will be able to include several heat transfer surfaces, each of them being linked to one and the same collector track.

In order for the energy transmitted by radiation from the heat transfer surface to the electronic component to be as great as possible, the internal layer of the printed circuit used for the heat transfer surface 140 is preferably the layer closest to the component. Ideally, the substrate used for the production of the printed circuit board offers little attenuation of infrared radiation.

The widths of the tracks 120 and 130 are adapted so as to best transmit the thermal energy in the zones of interest. Thus, the track 120, which is not intended to transmit the thermal energy, can be as thin as possible, so as to minimize the thermal conduction to the other elements of the printed circuit board. A track width of less than 1 mm, such as for example 0.6 to 0.8 mm, is a good compromise between the ohmic voltage drop and thermal conduction.

Similarly, the collector track 130 is wide in the zone of collection of the energy and of exchange toward the heat transfer surface 140, so as to promote the thermal conduction, and thinner in the zone linking electrically this track to a thermal potential, in order to minimize the thermal conduction in this zone.

The density of the metallic elements 131 and 141 linking respectively the collector track 130 to the heat transfer surface 140, and the heat transfer surface 140 to the package 150 of the electronic component, also impacts the quality of the heat exchanges, a strong density of metallic elements favoring the thermal conduction.

The invention therefore makes it possible to transfer heat or cold to an electronic component, without consideration as to the size of its package, by using standard active components and a standard printed circuit board production method. Indeed, the use of an internal thermal surface, directly linked to the package throught vias or throught a selection of leads of the package, is compatible with integrated circuits in ball or pin grid array packages, whereas this is not possible with the use of a thermal surface positioned on the surface of the printed circuit board, which would be less thermally efficient and would generate risks of short circuits. In the context of the invention, the vias or the leads whose electrical potential is equal to that of the transfer surface provide the heat/the cold to the integrated circuit by conduction, whereas the heat transfer surface situated under the whole package of the electronic component provides additional heat by radiation.

The efficiency of the heating or of the cooling is favored by the use of a limited exchange surface, which makes it possible to use active components of small size. This solution is robust, through the possible redundancy of the active elements around the electronic component, and through the use of surface-mount devices, that can easily be replaced when they are damaged.

Since the temperatures targeted by the anneal are very high (generally higher than a hundred or so degrees Celsius), the device can be associated with a power generation equipment item making it possible to power the heating elements of the printed circuit board.

The device can also be associated with a temperature probe glued to the component, or on a nearby zone, and with a temperature regulation system positioned on the printed circuit board, or outside it, as a function of the demands due to the exposure to the radiation. The regulation system is configured to activate or deactivate the active elements 101 during the annealing of the electronic component.

Figure 2:
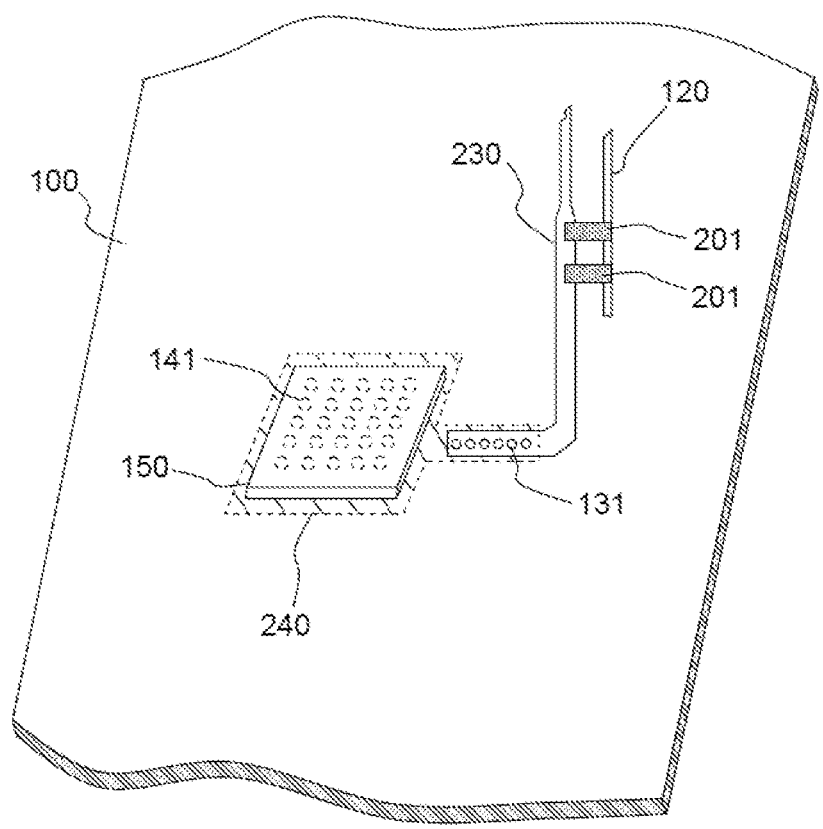
FIG. 2 presents a plan view of the device according to a second embodiment of the invention, in which the active elements are at a distance from the location of the electronic component.

Ideally, the active components are positioned in proximity to the electronic component to be heated, in order to reduce the size of the heat transfer surface and the length of the collector track. However, it is possible to remotely site the heat or cold production in dedicated zones of the printed circuit board, the form of the collector track and of the heat transfer surface being adapted to favor the heat exchanges. Such is the case represented in FIG. 2, in which the active components 201 are remotely sited, the heat transfer surface 240 then being adapted for covering the placement of the package 150 of the electronic component and a part of the collector track 230.

Figure 3A:
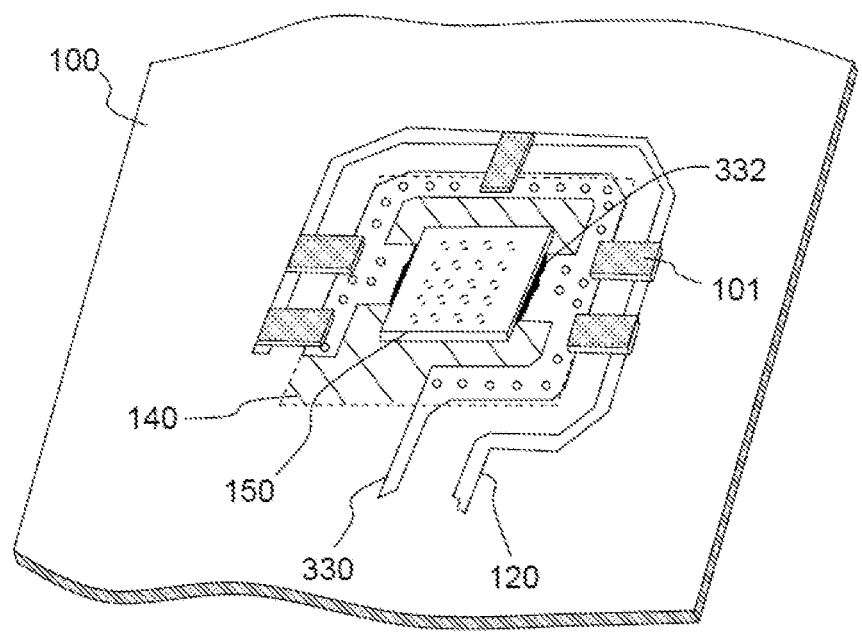
FIGS. 3a and 3b represent a plan view and a cross-sectional view of the device according to a third embodiment of the invention, in which the collector track is linked to the electronic component.
Figure 3B:
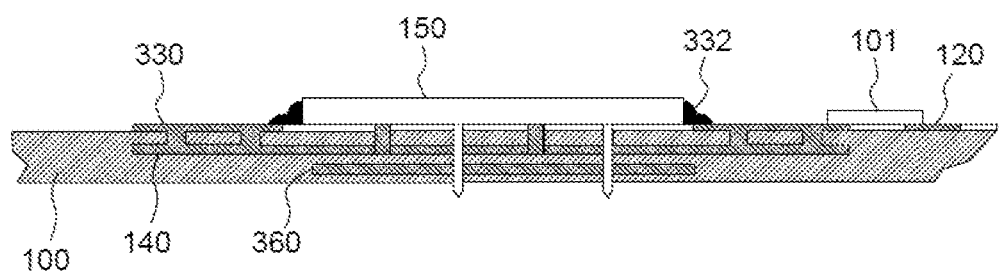

FIG. 3 illustrates a third embodiment, in which the collector track 330 is differentiated from the collector track 130 of FIG. 1 in that it is also adapted to be in thermal contact with the package 150 of the electronic component. The heat exchanges between the collector track and the component can be promoted by the use of thermal paste 332.

Advantageously, in order to promote the radiation from the heat transfer surface to the electronic component, a metallic reflector plane 360 is positioned under this heat transfer surface. The thermal energy radiated by the heat transfer surface 140 toward the reflector plane 360 is then returned to the heat transfer surface and the package 150 of the electronic component, thus reducing the energy losses.

Figure 4:
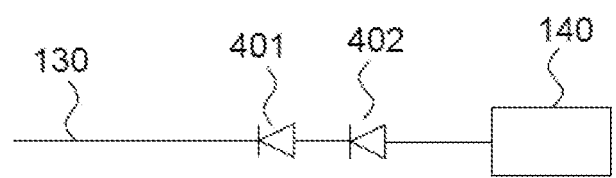
FIG. 4 presents an electrical circuit arrangement making it possible to electrically insulate the heat transfer surface from the collector track.

FIG. 4 presents an electrical circuit arrangement making it possible to electrically insulate the heat transfer surface from the collector track.

In the case where the electronic component is sensitive to current variations, it may be advantageous to electrically insulate the heat transfer surface from the collector track. For this purpose, power silicon diodes 401 and 402 are arranged top-to-tail between the collector track 130 and the heat transfer surface 140.

Figure 5:
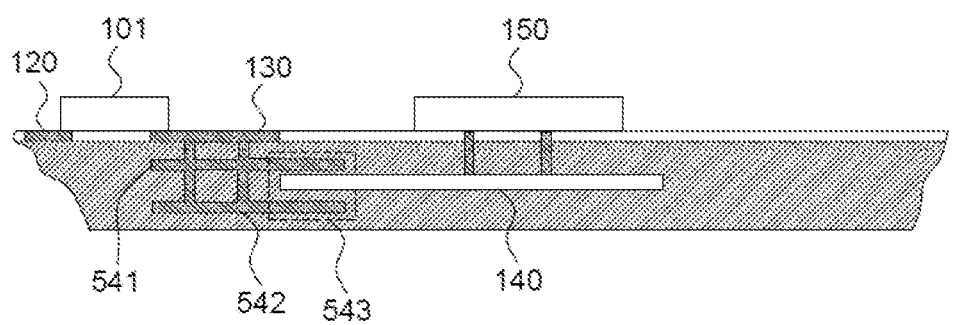
FIG. 5 presents another embodiment making it possible to electrically insulate the heat transfer surface from the collector track.

FIG. 5 presents another embodiment making it possible to electrically insulate the heat transfer surface. In this embodiment, the device for transferring the thermal energy between the active components 101 and the heat transfer surface 140 is embodied by an interleaving of layers internal to the substrate of the printed circuit board, thus making it possible to transfer the thermal energy by radiation to the heat transfer surface without producing electrical contact between this surface and the collector track. For this purpose, the heat transfer surface 140 internal to the substrate of the printed circuit board is positioned between at least two conductive surfaces 541 and 542, these conductive surfaces being situated in layers internal to the substrate of the printed circuit board, as close as possible to the heat transfer surface but without being in contact therewith. These conductive surfaces are linked to the collector track 130 or directly to the active components 101 by metallic elements such as vias or the leads of the components. A zone 543, common to the heat transfer surface 140 and to the conductive surfaces 541 and 542 situated on either side of this heat transfer surface, allows the transfer of thermal energy by radiation without placing the heat transfer surface 140 electrically in contact with the heating elements 101 of the device. According to the same principle, it is possible to use more than two conductive surfaces, to increase the radiated energy.

The invention also relates to a method using the device described previously to transfer heat to an electronic component in order to perform an anneal, the method consisting in powering active elements intended to produce heat, for a limited time, or up to a target temperature.

The method can also be followed by a step of powering active elements intended to produce cold, for a limited time, or until the temperature of the component is brought into a predefined range.

The invention claimed is:

1. A thermal conditioning device for operating a regeneration by a thermal anneal of a complementary metal oxide semi-conductor (CMOS) electronic component mounted in a package positioned on a multilayer printed circuit board, said device comprising:

at least one active component arranged on said multilayer printed circuit board, and suitable for producing or absorbing thermal energy, a collector track thermally linked to said at least one active component, said collector track being in contact with the package of the CMOS electronic component, at least one heat transfer surface internal in said multilayer printed circuit board, located under said package, a device for transferring the thermal energy between said at least one active component and said heat transfer surface, and at least one first metallic element linking said at least one heat transfer surface to said package situated in the multilayer printed circuit.

2. The thermal conditioning device for operating the regeneration by the thermal anneal of the CMOS electronic component as claimed in claim 1, wherein said at least one heat transfer surface is linked to said collector track from which it is electrically insulated by power diodes.

3. The thermal conditioning device for operating the regeneration by the thermal anneal of the CMOS electronic component as claimed in claim 1, wherein said device for transferring the thermal energy comprises at least one second metallic element linking said collector track to said heat transfer surface internal in the multilayer printed circuit board.

4. The thermal conditioning device for operating the regeneration by the thermal anneal of the CMOS electronic component as claimed in claim 1, wherein the at least one active component is at least one active component with through-hole leads, and wherein said device for transferring the thermal energy comprises at least one of the through-hole leads of the at least one active component.

5. The thermal conditioning device for operating the regeneration by the thermal anneal of the CMOS electronic component as claimed in claim 1, wherein said at least one heat transfer surface internal in the multilayer printed circuit board is positioned in an internal layer closest to the CMOS electronic component.

6. The thermal conditioning device for operating the regeneration by the thermal anneal of the CMOS electronic component as claimed in claim 1, wherein said device for transferring the thermal energy comprises a plurality of conductive surfaces internal in said multilayer printed circuit board, positioned on either side of a part of said at least one heat transfer surface without contact therewith, said conductive surfaces being linked to said at least one active component by at least one second metallic element or by at least one lead of said at least one active component.

7. The thermal conditioning device for operating the regeneration by the thermal anneal of the CMOS electronic component as claimed in claim 1, wherein the at least one active component are chosen from among a heating resistor and a thermoelectric element.

8. The thermal conditioning device for operating the regeneration by the thermal anneal of the CMOS electronic component as claimed in claim 1, wherein said at least one heat transfer surface is linked to an electrical potential of the multilayer printed circuit board.

9. The thermal conditioning device for operating the regeneration by the thermal anneal of the CMOS electronic component as claimed in claim 1, further comprising a module for regulating the temperature of the CMOS electronic component, configured to control the at least one active component.

10. A multilayer printed circuit board comprising a thermal conditioning device for operating a regeneration by a thermal anneal of a complementary metal oxide semi-conductor (CMOS) electronic component as claimed in claim 1.

11. A thermal conditioning method for operating a regeneration by a thermal anneal of a complementary metal oxide semi-conductor (CMOS) electronic component positioned in a package situated on a multilayer printed circuit board, said multilayer printed circuit board comprising a device as claimed in claim 1, comprising a step of temporary activation of at least one active component intended to produce heat.

12. The thermal conditioning method for operating the regeneration by the thermal anneal of the CMOS electronic component as claimed in claim 11, further comprising a later step after the step of temporary activation of the at least one active component to produce heat, of temporary activation of the at least one active component to produce cold.

* * * * *